United States Patent [19]

Tata

[11] Patent Number: 5,784,257
[45] Date of Patent: Jul. 21, 1998

[54] HEATSINK ASSEMBLY WITH ADJUSTABLE RETAINING CLIP

[75] Inventor: Peter D. Tata, Johnston, R.I.

[73] Assignee: Chip Coolers, Inc., Warwick, R.I.

[21] Appl. No.: 803,628

[22] Filed: Feb. 21, 1997

[51] Int. Cl.⁶ .................................................. H05K 7/20
[52] U.S. Cl. .................... 361/704; 165/80.2; 165/185; 174/16.3; 257/713; 257/719
[58] Field of Search ........................ 165/80.2, 80.3, 165/185; 174/16.3; 257/706, 707, 712, 713, 718–719, 726–727; 361/697, 704, 707, 710, 717, 718, 722

[56] References Cited

U.S. PATENT DOCUMENTS

| | | | |
|---|---|---|---|
| 2,916,159 | 12/1959 | O'Neill | 211/89 |
| 3,033,537 | 5/1962 | Brown, Jr. | 257/263 |
| 3,229,756 | 1/1966 | Keresztury | 165/67 |
| 4,345,267 | 8/1982 | Corman et al. | 357/81 |
| 4,607,685 | 8/1986 | Mitchell, Jr. | 165/80.3 |
| 4,660,123 | 4/1987 | Hermann | 361/386 |
| 4,745,456 | 5/1988 | Clemens | 357/79 |
| 5,313,099 | 5/1994 | Tata et al. | 257/717 |
| 5,329,426 | 7/1994 | Villani | 361/719 |
| 5,345,107 | 9/1994 | Daikoku et al. | 257/717 |
| 5,397,919 | 3/1995 | Tata et al. | 257/717 |
| 5,664,624 | 9/1997 | Tsai et al. | 165/80.3 |
| 5,667,870 | 9/1997 | McCullough | 257/718 |

FOREIGN PATENT DOCUMENTS

| | | |
|---|---|---|
| 0 130 279 | 3/1984 | European Pat. Off. |
| 29516627 U1 | 1/1996 | Germany |
| 58-176959 (A) | 12/1982 | Japan |

*Primary Examiner*—Gregory D. Thompson
*Attorney, Agent, or Firm*—Barlows & Josephs,Ltd.

[57] ABSTRACT

A heatsink assembly with an adjustable retaining clip is provided. A heatsink member is retained in flush communication with an electronic device package by securing a retaining clip over the heatsink member into communication with the marginal portions of the electronic device package. An adjustment member is provided through the top wall of the retaining clip to adjustably control the pressure and tension of the flush communication between the heatsink member and the electronic device package. A channel in the heatsink member may be provided for recessed installation of the retaining clip to permit unrestricted installation of a fan on the top of the heatsink.

21 Claims, 14 Drawing Sheets

HEATSINK ASSEMBLY WITH ADJUSTABLE RETAINING CLIP

BACKGROUND OF THE INVENTION

The present invention relates generally to a heatsink assembly for electronic solid state devices. More specifically, the present invention relates to heatsink assemblies for solid state devices, such as CPUs and for dissipating heat generated by such devices.

In the electronics and computer industries, there has been an ever-increasing use of smaller electronic components with greater functions thus requiring more and more power. As a result of higher power devices in smaller packages, the efficient removal of heat has become critically important. Electronic components, such as microprocessors, RAM, and the like, generate a great deal of heat during operation which must be removed to prevent adverse effects on operation of the electronic component itself as well as damage to the system into which it is installed.

It has been known in the prior art to thermally couple heatsinks with such devices in order to dissipate heat generated by the devices and, consequently, lower the temperature of the devices to safe limits. Many devices in the prior art include a thermally conductive metal heatsink member, typically with fins, which is placed into direct communication with the top surface of the heat generating electronic device package. The heatsink member is then secured to the top surface of the electronic device package by use of wires, and the like, to maintain the heatsink in thermally conductive relation to the electronic device package. These clips are typically snapped over the heatsink member to engage either the electronic device package or the socket into which the electronic device package is installed. As a result, the thermal contact can be made to provide heat dissipation, as desired.

In addition, heatsinks have also been permanently bonded to the electronic device package to provide an efficient thermal coupling between the two components; however, over time the bond tends to break thereby adversely effecting the thermal path between the heatsink and the device package.

However, the foregoing attempts in the prior art suffer from the adverse effects of being exposed to a high temperature environment over a long period of time. More specifically, these structures of the prior art, while effective at the time of installation, the clamping forces or the adhesion forces which maintain the heatsink in firm engagement with the electronic device package tends to be inconsistent as the electronic device package heats up. The clip biasing the heatsink against the device package and the permanent bond material, such as glue, fails over time thus severely degrading the thermal path of heat from the electronic device package to the heatsink member. Moreover, the thermal expansion of the parts of the heatsink assembly cause a slight tilting of the heatsink surface to break the plane of contact with the top surface of the electronic device package. Even with the employment of thermal grease between the heatsink member and the electronic device package, it is found that the thermal coupling severely degrades in these prior art structures with the result that the device package overheats and causes decreased system performance.

Another approach to preventing overheating is to mount a small fan on the heatsink to increase thermal dissipation of the heatsink. While this can be very effective in maintaining the temperature of the device package to acceptable levels, it is not only costly if operation of the fan is interrupted due to some malfunction, but the device will be ineffective to prevent unwanted temperature rise. Consequently, there have been attempts in the prior art to incorporate both a clip for retaining the heatsink member in communication with the electronic device package in addition to a small fan. However, these devices are somewhat universal in construction in that they fail to take into account slight imperfections in the heatsink member, the electronic device package and/or the socket into which the electronic device package is installed. Due to this "universal" construction found in the prior art, the structure for retaining the heatsink in thermal coupling with the electronic device package cannot always maintain the critical thermal coupling. With these prior art devices, there are no means to adjust the tension of thermal coupling or the position of the heatsink member on the electronic device package.

Due to the demand for a heatsink assembly which can be customized and also accommodate a fan, it is desirable for such a heatsink assembly to include an adjustable retaining clip which can be easily changed to provide a coupling pressure of securement of the heatsink member to the electronic device package. It is also desirable to provide a heatsink assembly with an adjustable clip which will not hinder or prevent the use of an additional fan for further heat dissipation. It is also desirable to provide a heatsink assembly with an adjustable retaining clip which is low profile to permit the easy installation on an electronic device package in cramped spaces such as in a laptop computer.

SUMMARY OF THE INVENTION

The present invention preserves the advantages of prior art heatsink assemblies for electronic device packages. In addition, it provides new advantages not found in currently available heatsink assemblies and overcomes many disadvantages of such currently available heatsink assemblies.

The invention is generally directed to a novel and unique heatsink assembly with particular application in dissipating heat from electronic device packages, such as microprocessors, and the like. The heatsink assembly of the present invention enables the simple, easy and customizable installation of a heat dissipating heatsink member to a heat generating electronic device package.

The preferred embodiment of the present invention includes three primary members. A heatsink member, with a flat bottom surface and an upper surface, is disposed on an electronic device package with the flat bottom surface of the heatsink member being in flush communication with the top surface of the electronic device package. A retaining clip, with a central member and at least a pair of legs depending downwardly from respective opposing ends of the central member with ends of the pairs of legs not connected to the central member being free ends. An aperture is disposed through the central member defining a bore with female threading thereon. The free ends of the pair of legs are secured to the electronic device package by inwardly extending lips, or the like with the retaining clip being positioned over and embracing the heatsink member with the bore being proximal to the upper surface of the heatsink member. In addition, a cylindrical adjustment member, with male threading thereon, is threadably received through the bore into communication with the upper surface of the heatsink member to maintain the heatsink member in pressure and tension controlled flush communication with the electronic device package.

In operation, the heatsink member is placed over and in communication with the top surface of the electronic device package with optional thermal grease or interface material disposed therebetween. The retaining clip is placed over the heatsink member so that the free ends of the downwardly depending legs engage with the opposing marginal portions of the electronic device package or the marginal portions of the socket into which the electronic device package is installed. The cylindrical adjustment member is threaded through the bore in the central member of the retaining clip into contact with the upper surface of the heatsink member to provide downward pressure thereon. Rotation of the cylindrical adjustment member thereby adjusts the downward tension and pressure of the heatsink member onto the electronic device package while maintaining such members in flush communication with each other.

It is therefore an object of the present invention to provide a heatsink assembly with a retaining clip which is adjustable to permit alteration of the pressure and tension of the heatsink member on the electronic device package.

Another object of the present invention is to provide a heatsink assembly which can maintain thermal coupling of a heatsink member to an electronic device package without adhesive bonding material.

It is a further object of the present invention to provide a heatsink assembly which can be adjusted over time to compensate for changes of the heatsink member and electronic device package structures due to exposure to high temperature environments.

It is yet a further object of the present invention to provide a heatsink assembly for cramped system environments while permitting the use of an auxiliary fan.

It is another object of the present invention to provide a heatsink assembly which can be easily installed into cramped system environments.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
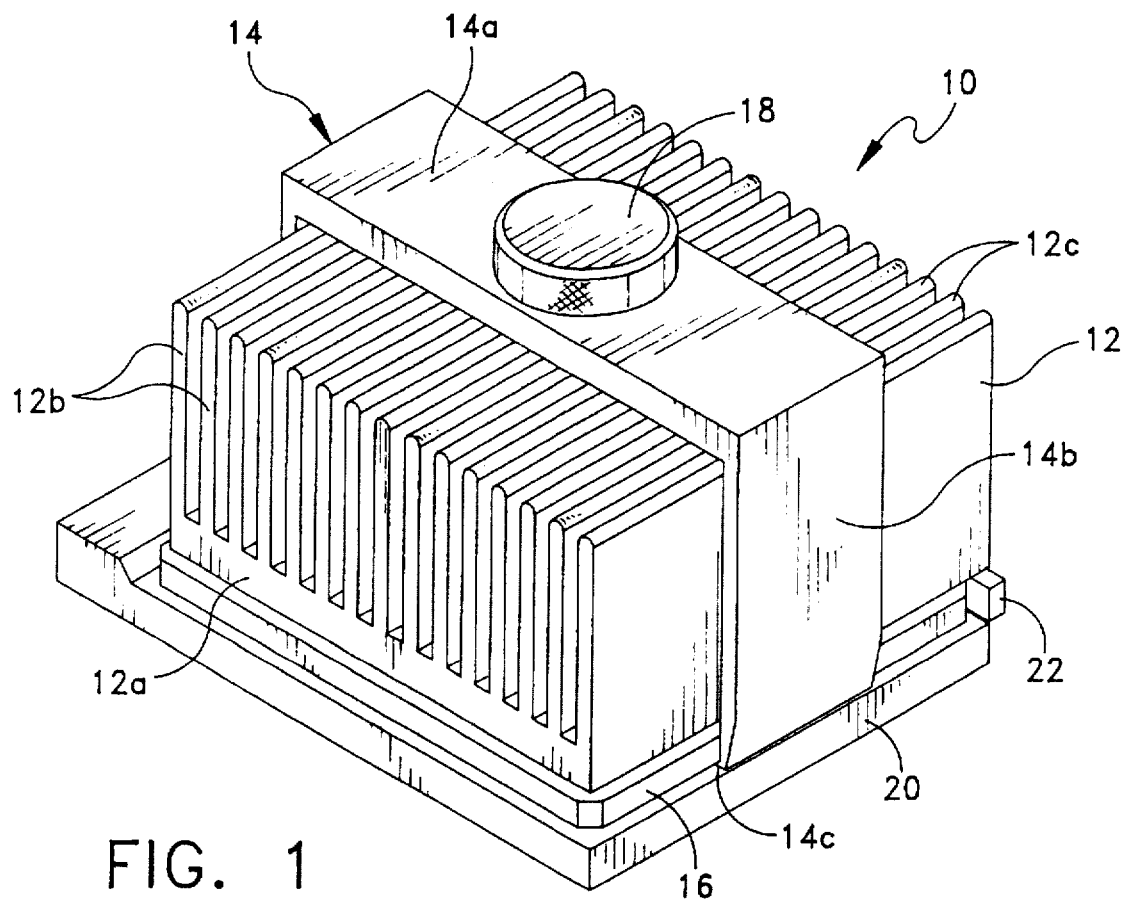
FIG. 1 Is a perspective view of the preferred embodiment of the heatsink assembly of the present invention.

Referring to FIG. 1, the perspective view of the heatsink assembly of the preferred embodiment of the present invention is shown. The heatsink assembly, generally referred to as 10, is shown to include an adjustable retaining clip 14 for securing heatsink member 12 to an electronic device package 16, such as a PENTIUM microprocessor.

Figure 2:
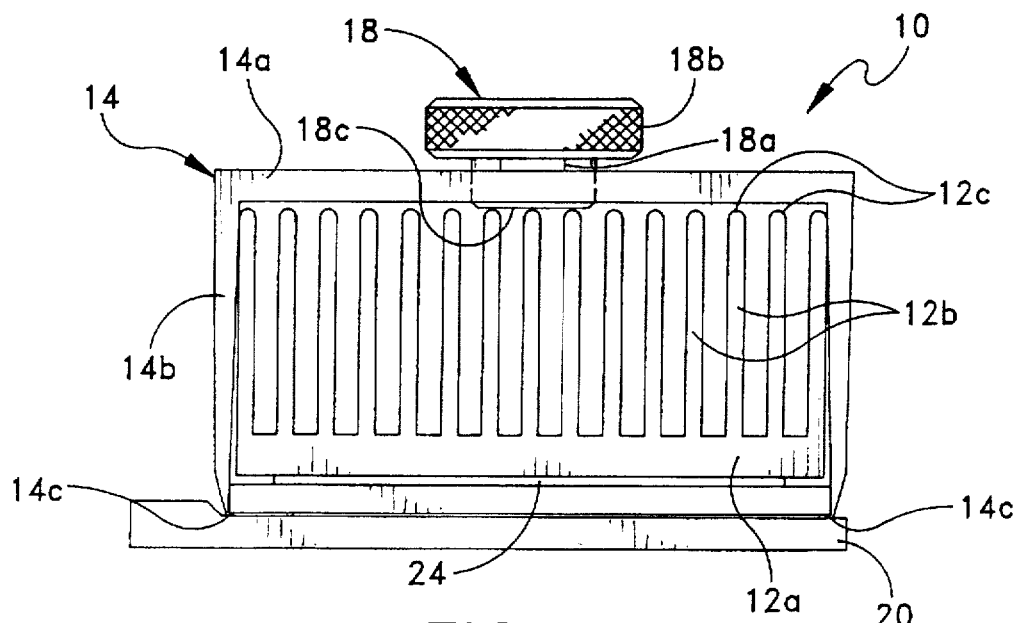
FIG. 2 is a front view of the heatsink assembly of FIG. 1.

Referring both to FIGS. 1 and 2, electronic device package 16 is installed into a socket 20 which may be a standard electronic device socket or a ZIF (zero insertion force) type socket which includes socket release handle 22. Electronic device package 16, installed in socket 20, carries heatsink 12 which includes base 12a, upstanding fins 12b and a top contact surface 12c. Retaining clip 14, in the preferred embodiment, includes central member 14a with downwardly depending legs 14b connected thereto. The free ends of both of the downwardly depending legs 14b include inwardly directed lips 14c which engage the marginal portions of electronic device package 16. It is preferred that two downwardly depending legs 14b be provided on opposing sides from one another. However, additional legs may be provided for additional security or to accommodate different types of solid state devices or the sockets into which they are installed.

Optionally, an interface material 24 may be disposed between heatsink member 12 and electronic device package 16 to facilitate thermal coupling and transfer. The interface material may be metallic film, thermal grease, or the like.

As will be discussed in greater detail below, adjustment member 18 includes a cylindrical base 18a with male threading thereon, a knurled head 18b to facilitate rotation as well as a bottom surface to contact top surface 12c of heatsink member 12. Upon rotation of knurl head 18b, male threaded cylindrical base 18a is threaded through the bore to enable bottom surface 18c to adjustably contact top surface 12c. As a result, heatsink member 12 is placed in controlled flush communication with electronic device package 16 with the option of interface material 24 lying therebetween.

Figure 3:
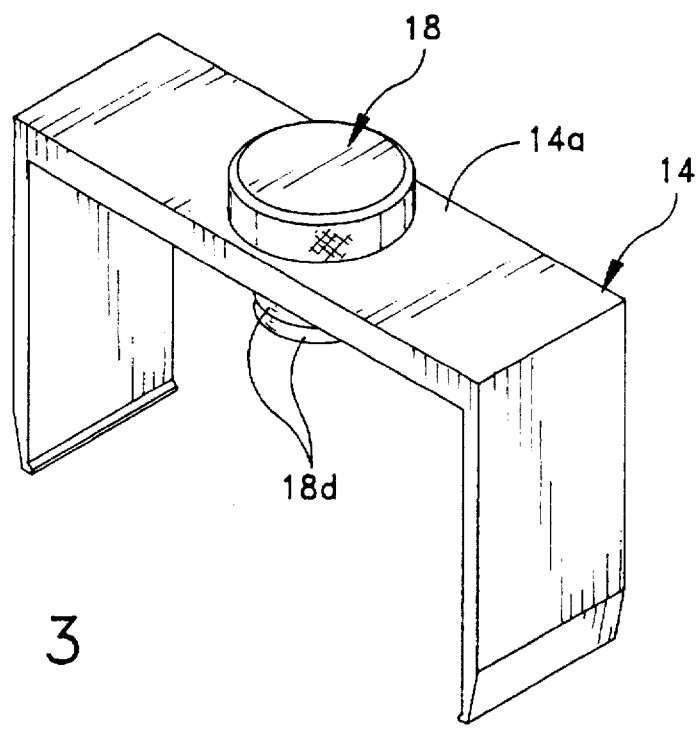
FIG. 3 is a perspective view of the retaining clip and adjustment member of the present invention.
Figure 4:
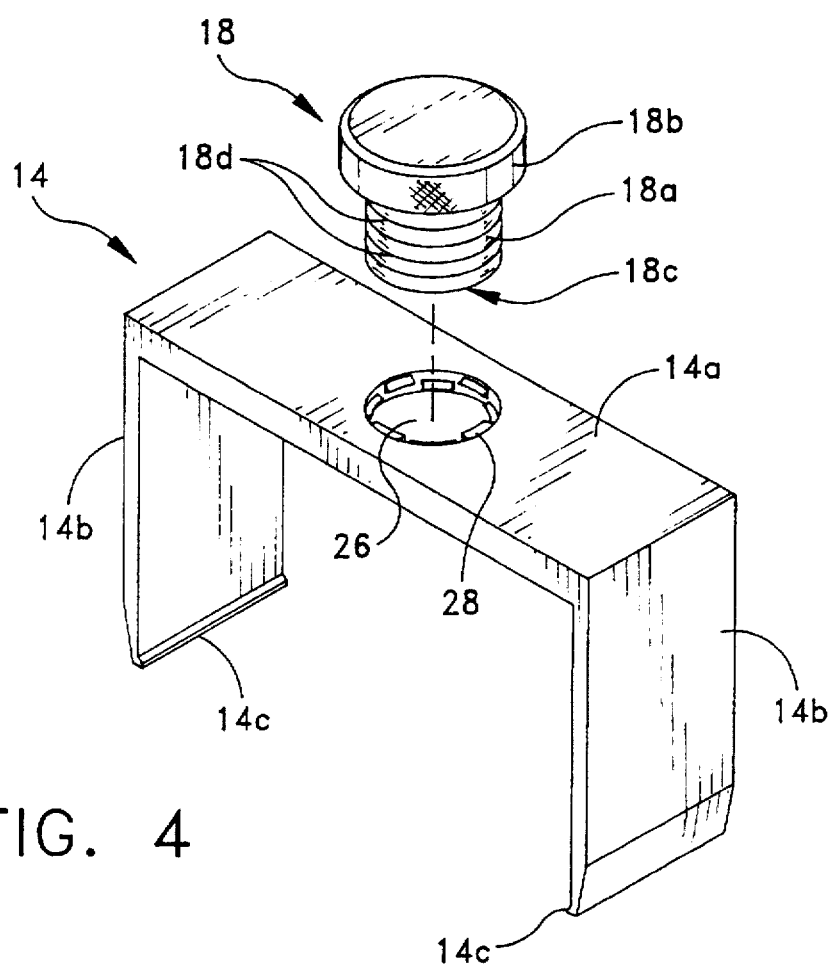
FIG. 4 an exploded view of the retaining clip and adjustment member of FIG. 3.

Referring now to FIGS. 3–7, details of the adjustable retaining clip according to the present invention is shown. FIG. 3 generally shows adjustment member 18 threadably received through central member 14a of retaining clip 14. FIG. 4 further shows an exploded view of the retaining clip arrangement shown in FIG. 3 to reveal central bore 26 which carries female threads 28 thereon to threadably communicate with male thread 18d on cylindrical base 18a. Female threads 28 are shown as interrupted segments in a standard helical pattern for ease of manufacture. However, threads 28 may also be a continuous single thread helical pattern or other types of interrupted thread configurations.

Figure 5:
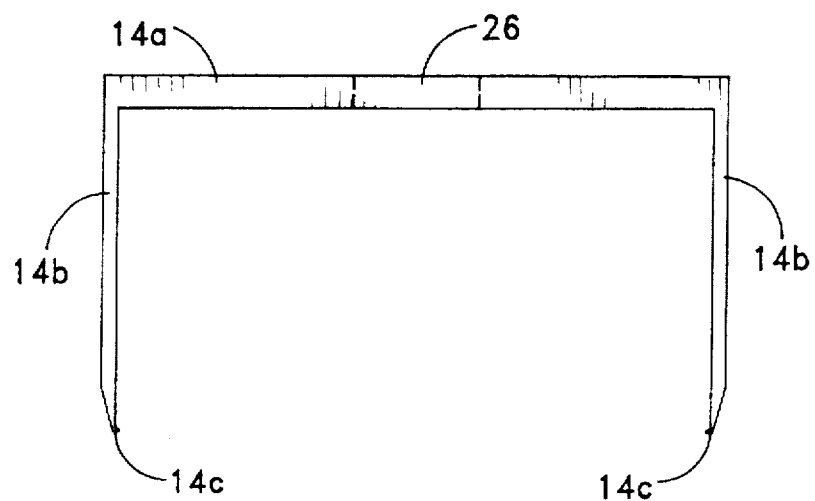
FIG. 5 is a front view of the retaining clip of the present invention shown in FIG. 3.
Figure 6:
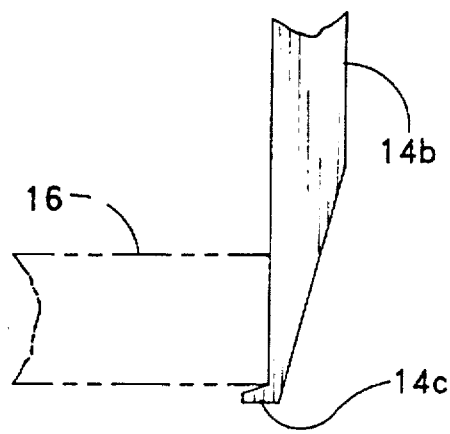
FIG. 6 is a close-up front view of the retaining clip of the present invention illustrating connection of the downwardly depending legs to an electronic device package.
Figure 7:
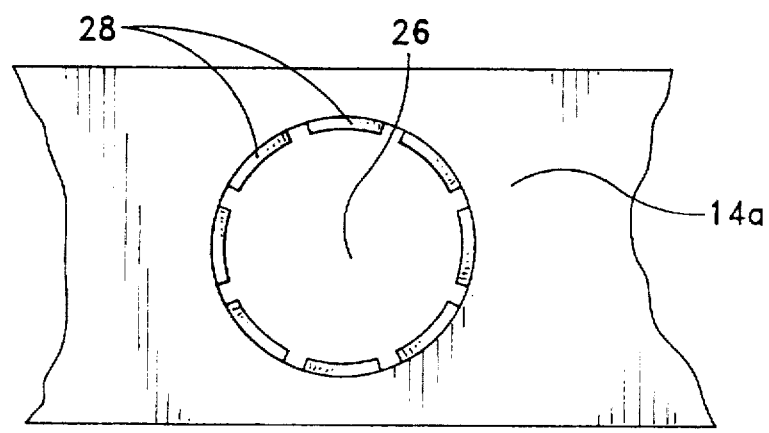
FIG. 7 is A top view of the retaining clip of the present invention shown in FIG.
Figure 14:
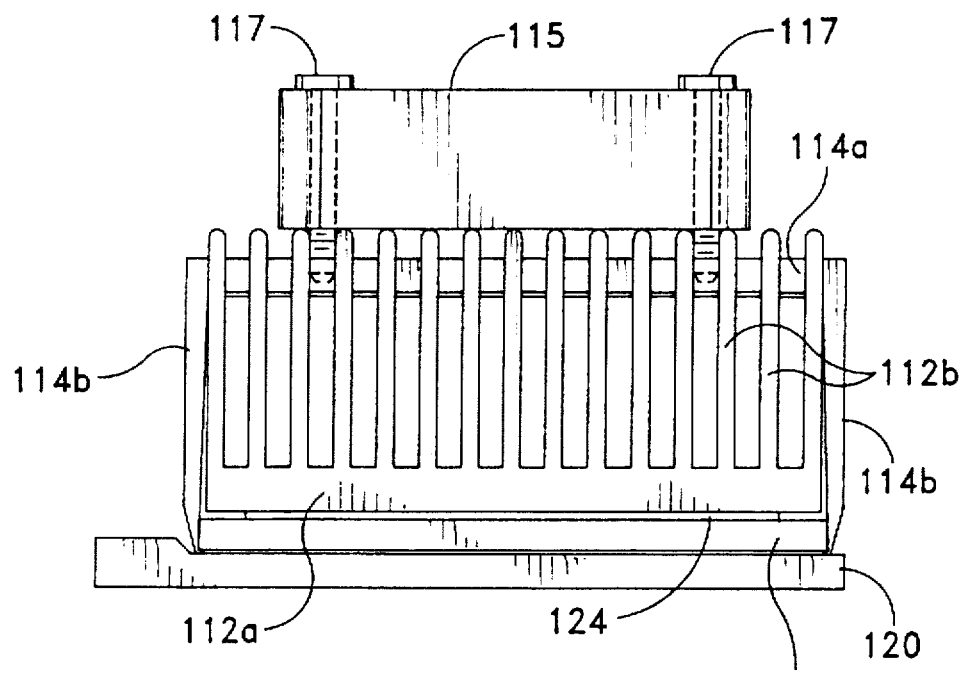
FIG. 14 is a front view of the alternative embodiment of FIG. 12.

FIG. 5 illustrates a side view of retaining clip 14 with adjustment member 18 removed for ease of illustration. Central bore 26 is disposed, preferably, approximately midway along the length of central member 14a. FIG. 6 provides a close-up view of the preferred structure for securing the free ends of downwardly depending legs 14b to the electronic device package 16. Inwardly directed lips 14c are provided to engage the marginal portions of electronic device package 16. FIG. 7 5 illustrates a top view of the retaining clip of FIG. 14 showing, in more detail, female threads 28 on central bore 26 which resides through central member 14a.

Figure 8:
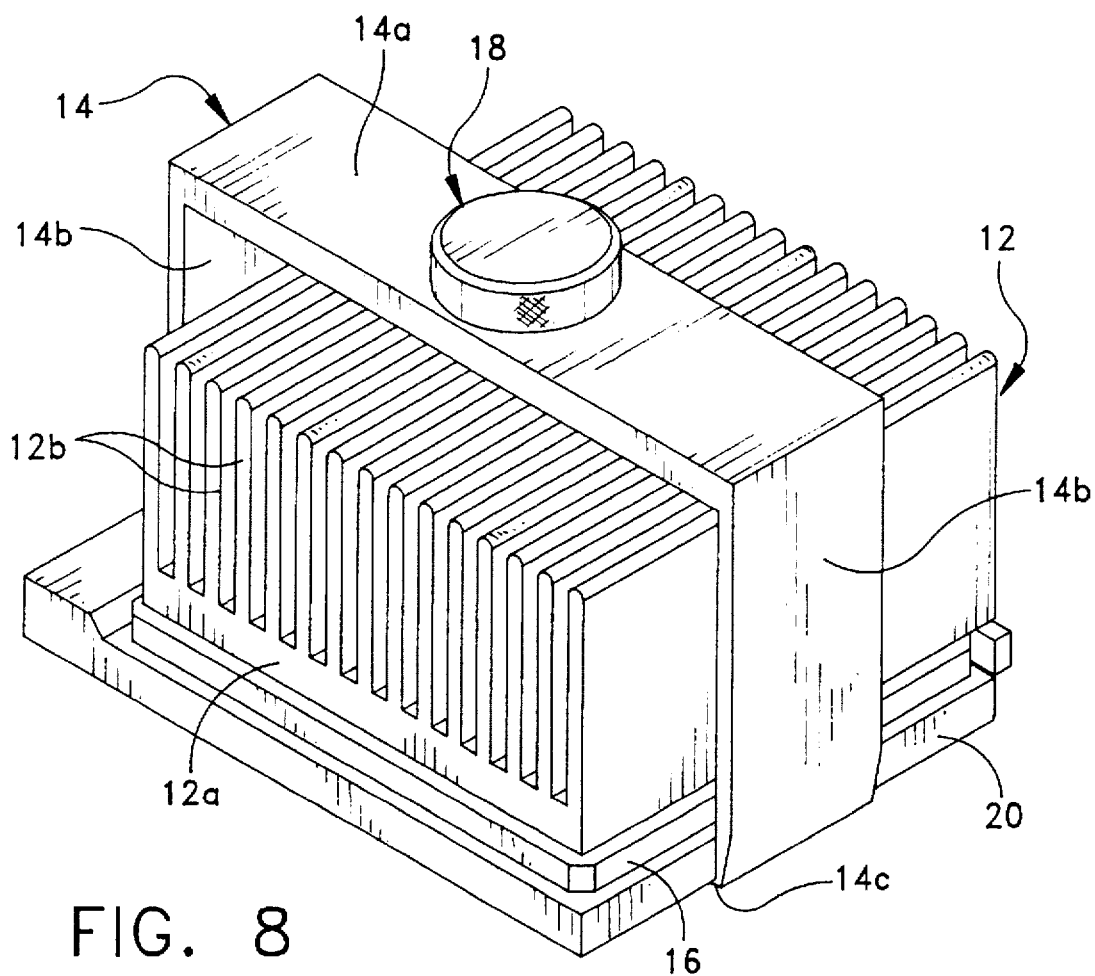
FIG. 8 is a perspective view of an alternative embodiment of the present invention show in FIG. 1.
Figure 9:
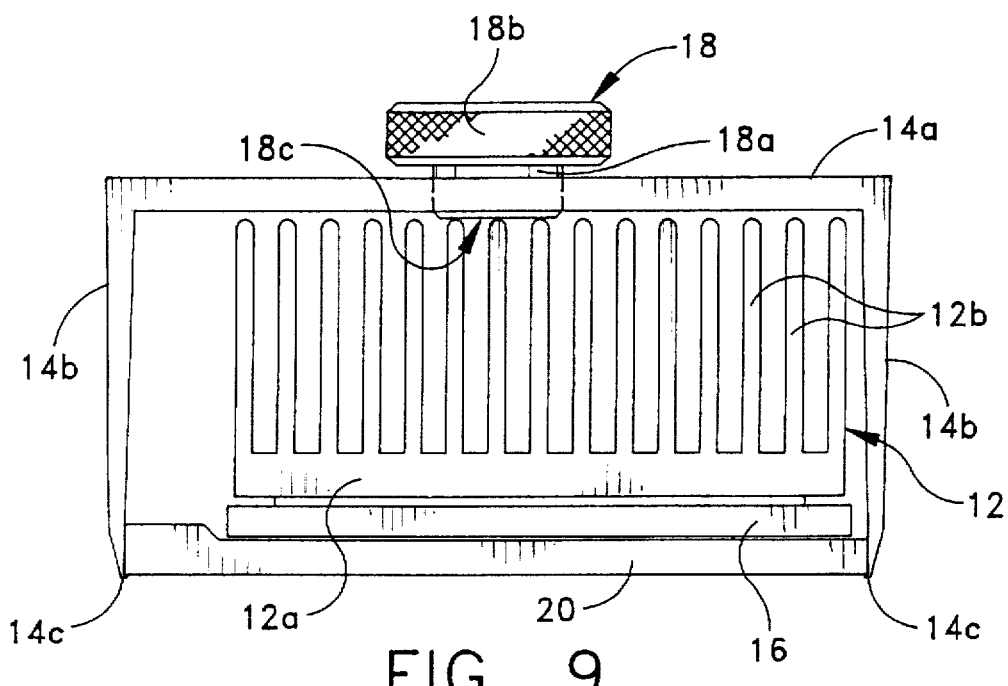
FIG. 9 is a front view of the alternative embodiment shown in FIG. 8.

Turning now to FIGS. 8 and 9, an alternative embodiment of the invention in FIG. 1 is shown. Referring first to FIG. 8, a perspective view of the alternative embodiment is shown to include downwardly depending legs 14b which are slightly elongated as compared to downwardly depending legs 14b shown in FIG. 1, in order to engage the marginal portions of socket 20 as opposed to the marginal portions of electronic device package 16. Adjustment member 18, threaded through retaining clip 14, now maintains heatsink member 12, electronic device package 16 and socket 20 sandwiched together to achieve superior thermal coupling and heat transfer. Connection to socket 20 is particularly desirable in "tower" computer systems, where the motherboard is vertically positioned, to prevent the weight of the heatsink from pulling the microprocessor from its socket.

Figure 10:
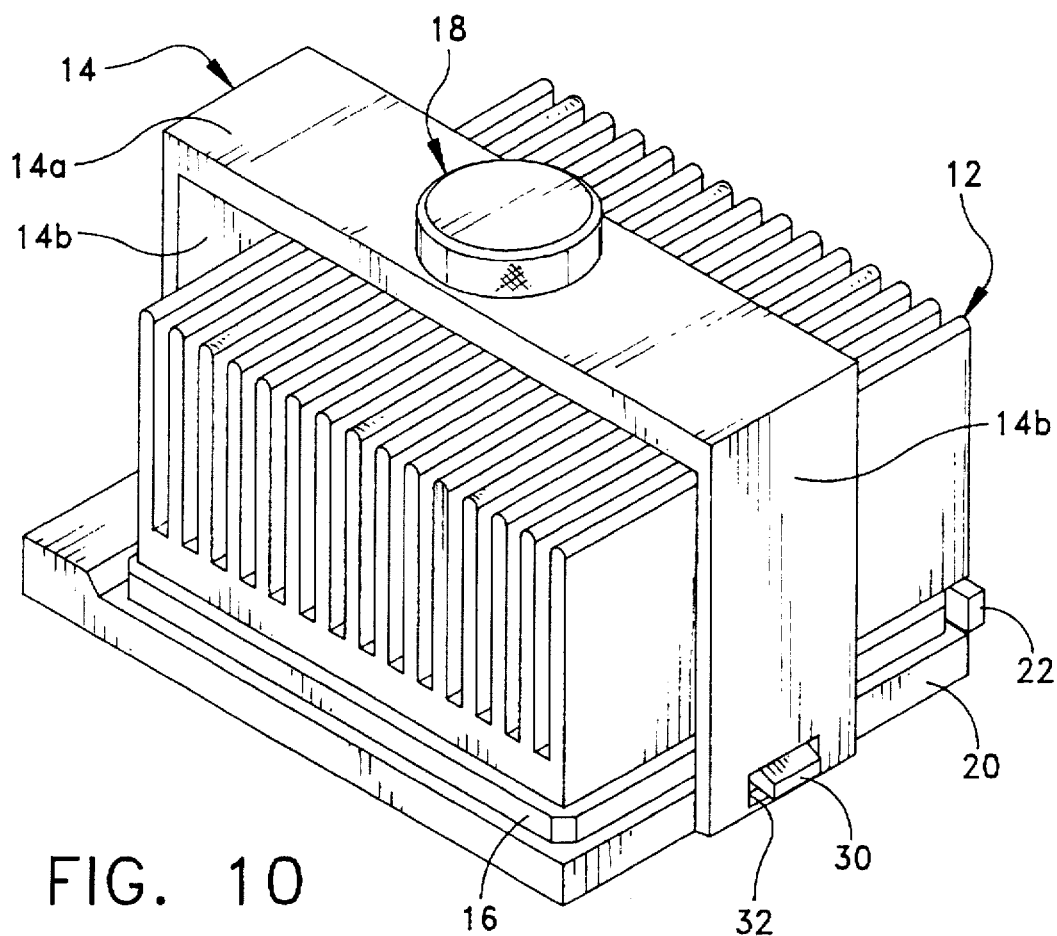
FIG. 10 is a perspective view of another alternative embodiment of the present invention shown in FIG. 1.
Figure 11:
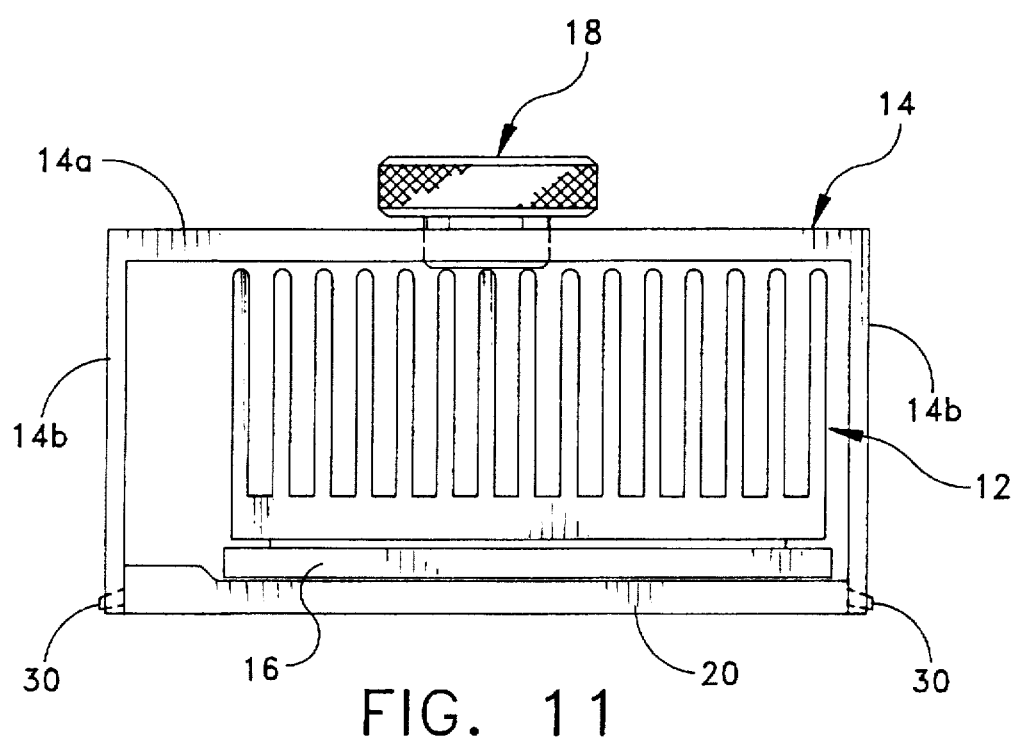
FIG. 11 is a front view of the alternative embodiment shown in FIG. 10.

FIGS. 10 and 11 show a further alternative embodiment of the invention shown in FIG. 1 to provide a further alternative to the downwardly depending legs attachment structure shown in FIGS. 8 and 9. In many ZIF-type sockets, protrusions 30 are present and emanate directly outward and are capable of being secured to. In the alternative embodiment shown in FIGS. 10 and 11, downwardly depending legs 14b include leg apertures 32 for engaging the ZIF socket protrusions 30. Upon snapping retaining clip 14 into place, adjustment member 18 is tightened down into place to successfully achieve superior thermal coupling by, again, sandwiching heatsink member 12, electronic device package 16 and socket 20 together.

Figure 12:
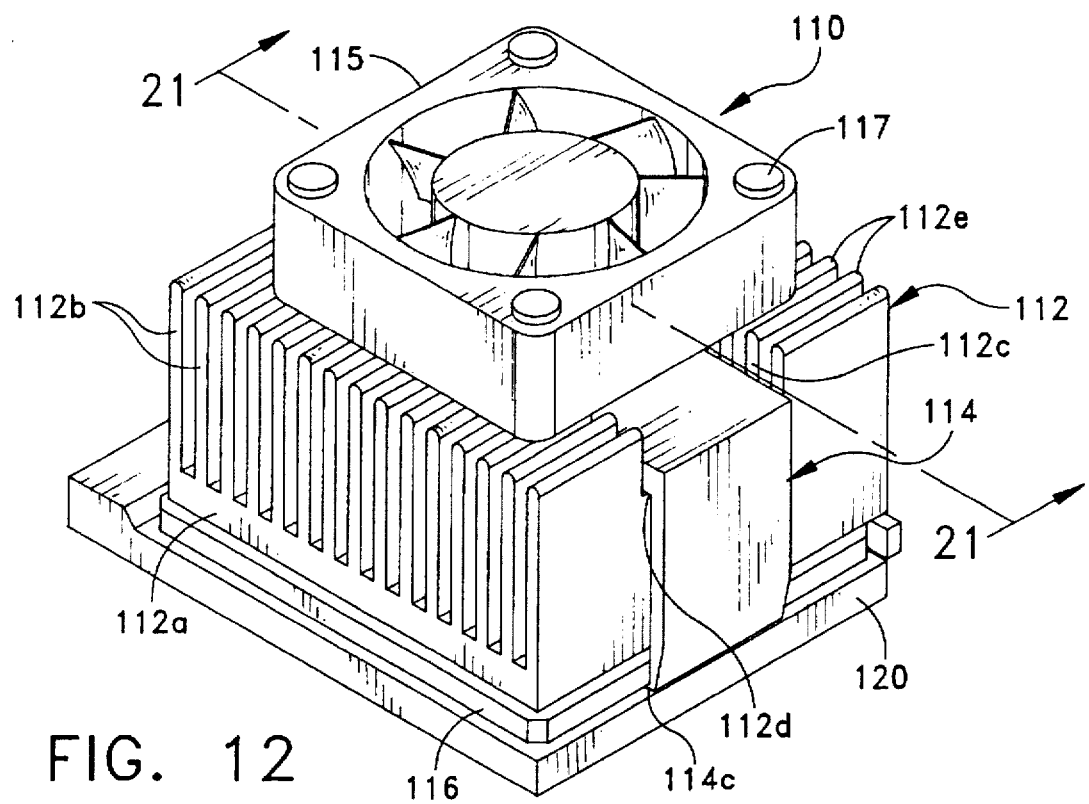
FIG. 12 is a perspective view of yet another alternative embodiment of the present invention.
Figure 13:
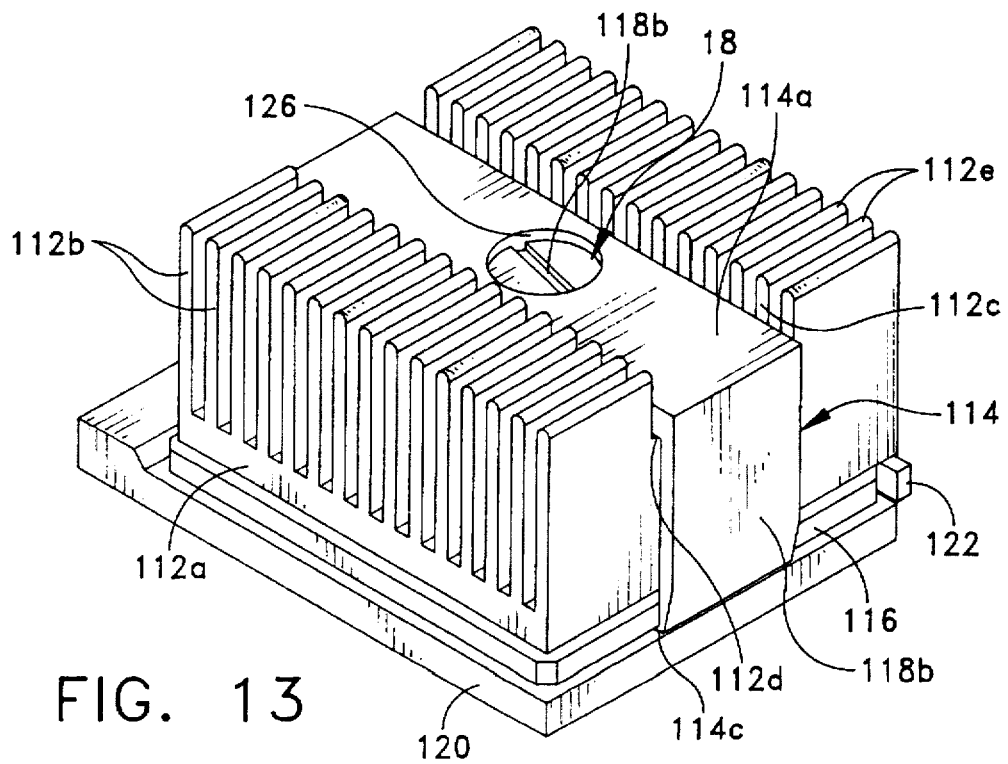
FIG. 13 is a perspective view of the alternative embodiment of FIG. 12 with fan removed.

FIGS. 12–25 illustrate further embodiments of the invention shown in FIG. 1. Referring first to FIG. 12, a completely assembled and installed alternative embodiment 110 of the heatsink assembly of the present invention is shown. A socket 120 is provided for receiving electronic device package 116. Disposed on the electronic device package 116 is heatsink member 112 with upstanding fins 112b and base 112a. Disposed through fins 112b is a channel 112c defining a floor 112d. As best seen in FIG. 13, retaining clip 114 is received over heatsink member 112 and within channel 112c. In similar fashion to the preferred embodiment of the present invention in FIG. 1, inwardly directed lips 114, disposed at the free ends of downwardly depending legs 114b, engage the marginal portions of electronic device package 116 to effectively sandwich heatsink member 112 and electronic device package 116 together. The inclusion of channel 112c permits retaining clip 114 to be recessed relative to top surface 112e of the heatsink member thus enabling a fan to be installed, without restriction, thereon. Fasteners 117, such as screws, secure fan 115 to the top surface 112e of the heatsink member. The ability of the retaining clip to remain recessed to permit installation of fan 115 can be seen by FIG. 14, which is a front view of the alternative embodiment shown in FIG. 12.

Figure 15:
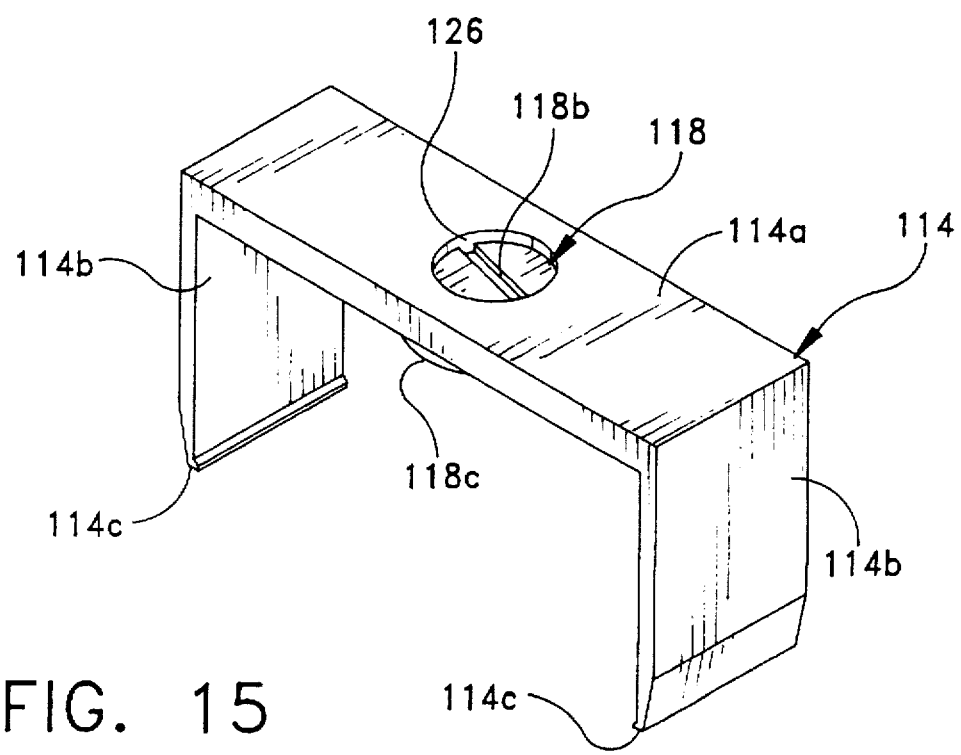
FIG. 15 is a perspective view of the retaining clip and adjustment member of the alternative embodiment shown in FIG. 12.
Figure 16:
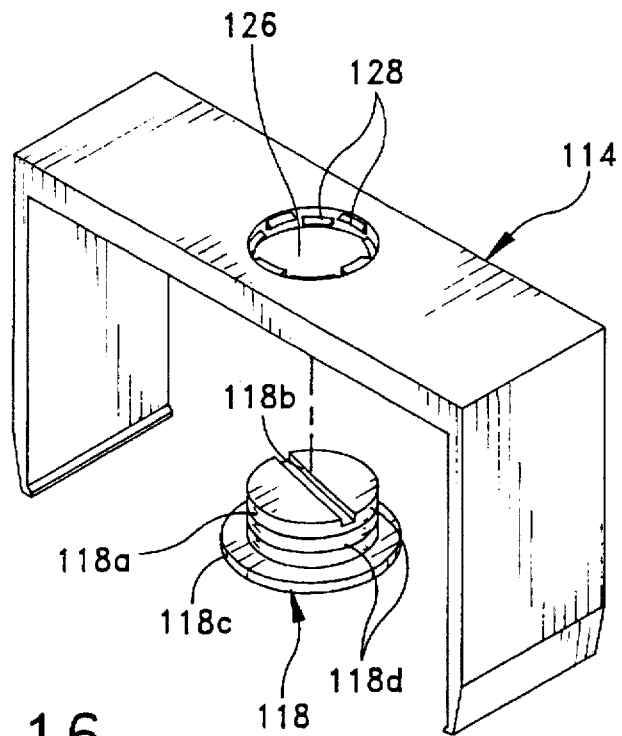
FIG. 16 is an exploded perspective view of the retaining clip and adjustment member shown in FIG. 15.
Figure 17:
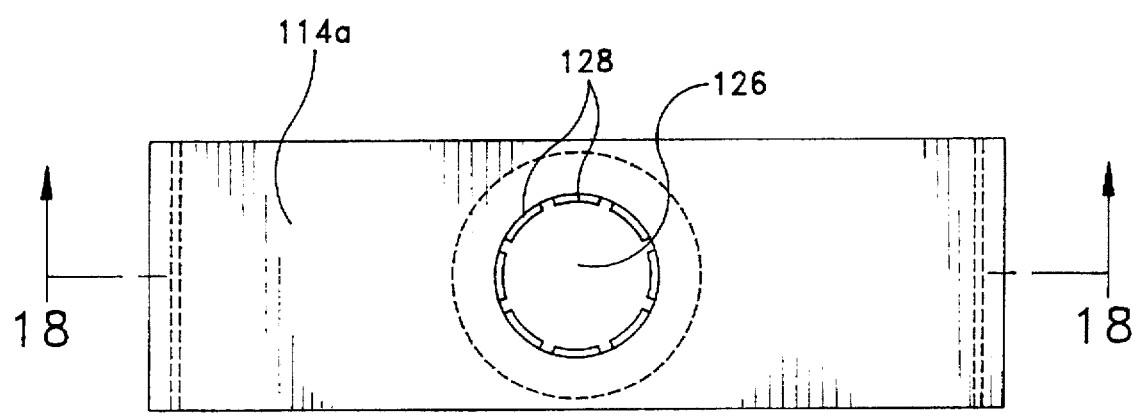
FIG. 17 is a top view of the retaining clip shown in FIG. 16.

Turning now to FIGS. 15–20, details of the adjustable retaining clip 114 and adjustment member 118 are shown. Referring first to FIG. 15, retaining clip 114 includes downwardly depending legs 114b with, preferably, inwardly directed lips 114c for engaging the marginal portions of electronic device package 116. Central bore 126 is provided through central member 114a to threadably receive adjustment member 118. FIGS. 16 and 17 illustrate female threads 128 disposed about central bore 126. Adjustment member 118 preferably includes cylindrical base 118a, slot 118b to facilitate rotation of the cylindrical base 118a, male threads 118d and foot 118c to maximize the contact surface of adjustment member 118a to the floor 112d of channel 112c, as will be described in detail below. As described above, female threads 128 are shown as interrupted thread segments but may be one continuous helical thread or other thread configurations.

Figure 18:
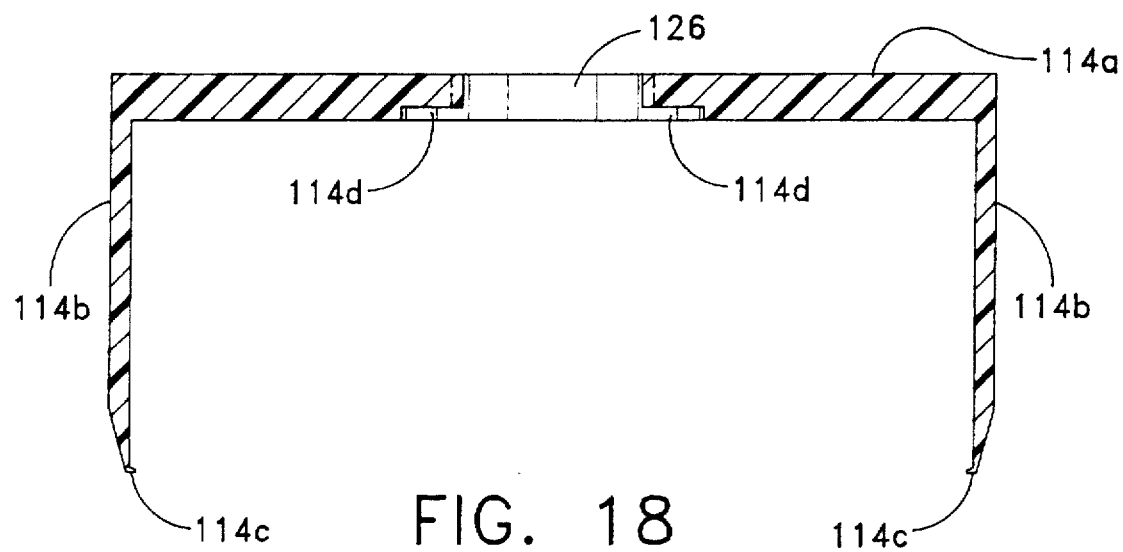
FIG. 18 is a cross-sectional view through the line 18—18 of FIG. 17.
Figure 19:
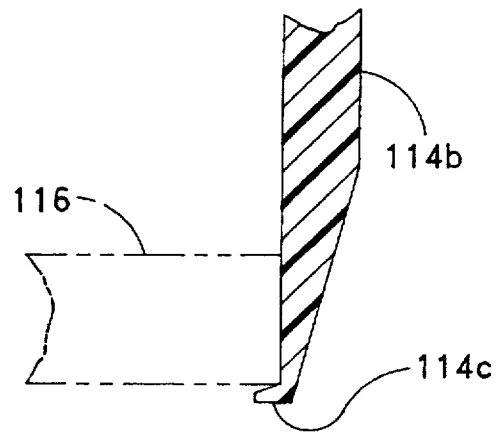
FIG. 19 is a close-up cross-sectional view of the retaining clip of FIG. 18 illustrating attachment to an electronic device package.
Figure 20:
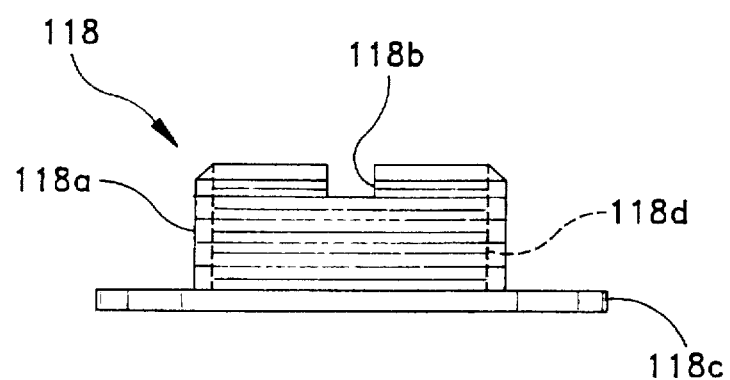
FIG. 20 is a side view of the cylindrical adjustment member shown in FIG. 16.

FIG. 18 shows a cross-sectional view through the line 18—18 of FIG. 17. Central bore 126 through central member 114a is provided along with a circumferential seat 114d to receive foot 118c when adjustment member 118 is threaded completely up into central bore 126. FIG. 19 provides a close-up view of the preferred structure for securing downwardly depending legs 114b to electronic device package 116. Inwardly projecting lips 114c engage the marginal portions of electronic device package 116. FIG. 20 illustrates the details of adjustment member 118. Cylindrical base 118a with male threads 118d thereon is provided with foot 118c to enlarge the contact surface of cylindrical member 118. Slot 118b is provided through the top of the adjustment member to facilitate rotation thereof by a flathead screw driver, coin or the like. Other configurations, such as a hex-shaped recess may be employed instead of slot 118b to facilitate rotation by a corresponding hex-shaped tool.

Figure 21:
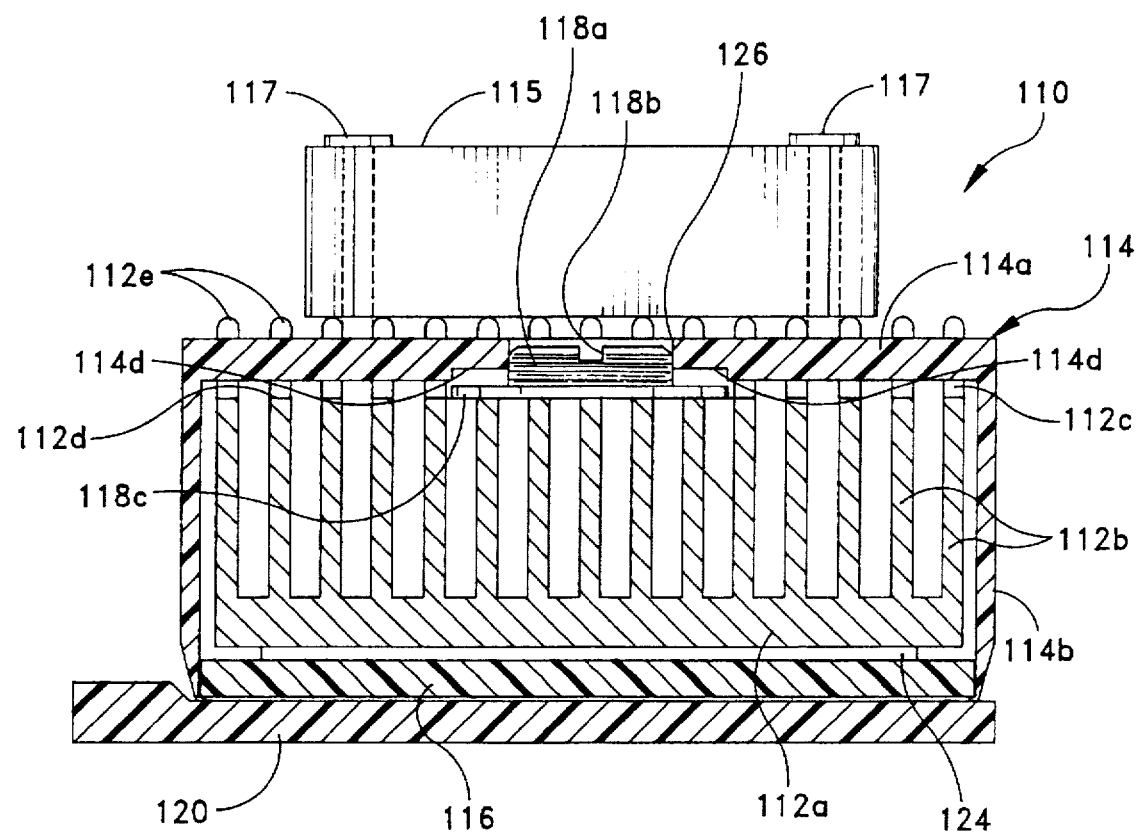
FIG. 21 is a partial cross-sectional view through the line 21—21 of FIG. 12.

FIG. 21 illustrates a partial cross-sectional view through the line 21—21 of FIG. 12. Heatsink assembly 110 is illustrated in an installed operational condition. Electronic device package 116 is installed in socket 120. A finned heatsink member 112 is disposed over the electronic device package 116 with an optional interface material 124 disposed therebetween. Retaining clip 114 resides within channel 112c to permit installation of fan 115 on top surface 112e of the heatsink member 112. Thereunder, adjustment member 118 is threadably received through central bore 126 to provide foot 118c into direct contact with channel floor 112d.

Seat 114d is provided in the underside of retaining clip 114 to permit adjustment member 118 to be threaded completely up into central bore 126 for ease of installation. More specifically, the retraction of adjustment member 118 up into bore 126 provides a smooth underside surface of central member 114a to allow the retaining clip to easily slide laterally over the top surface 112e of the heatsink member and then drop into channel 112c. This is particularly useful in cramped environments such as laptop computers and the like. Upon sliding the retaining clip into place, it may be simply pressed down over heatsink member 112 to cam out downwardly depending legs 114b over the marginal portions of electronic device package 116. Alternatively, if sufficient space is available, one leg may be placed under the electronic device package 116 and the other leg pulled over the opposing marginal portion by the installer. With the retaining clip 114 in place, a suitable tool is employed to downwardly thread adjustment member 118 through central bore 126 until foot 118c contacts channel floor 112d. Adjustment member 118 is further threaded until the desired pressure and tension is achieved. Once retaining clip 114 is secured in place, fan 115 may then be installed to top surface 112e via fasteners 117 in the usual fashion.

Figure 22:
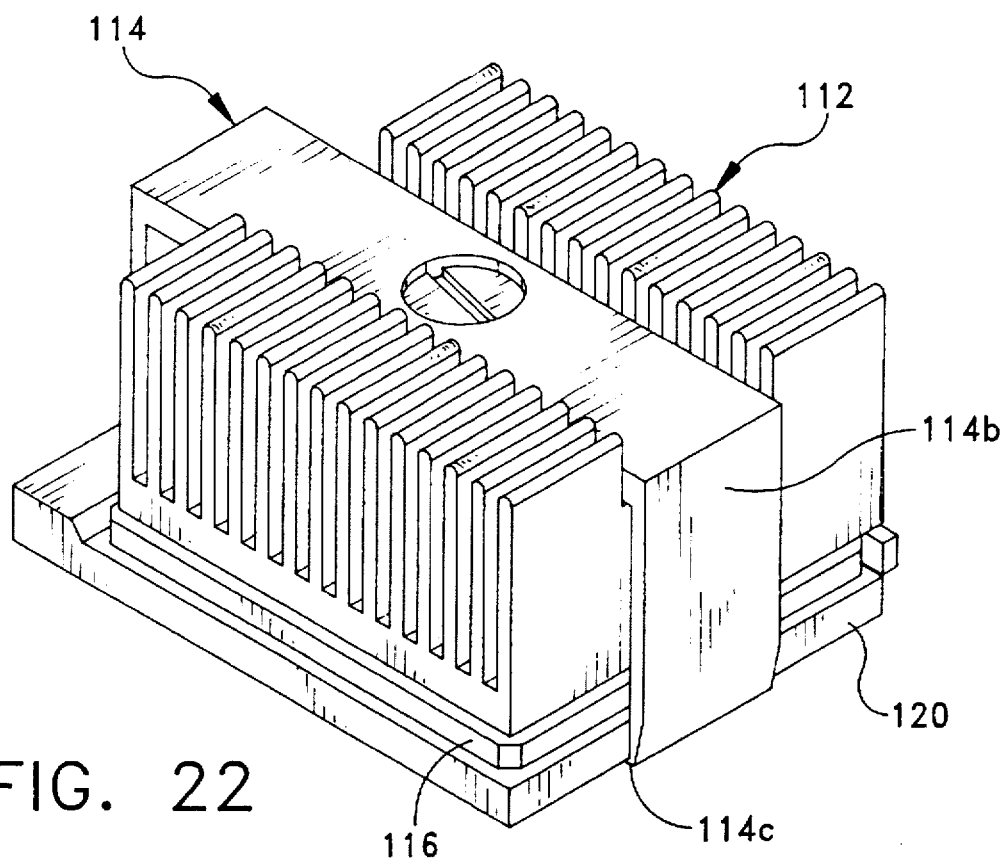
FIG. 22 is another alternative embodiment of the present invention illustrating connection of the retaining clip to the socket into which the electronic device package is installed.
Figure 23:
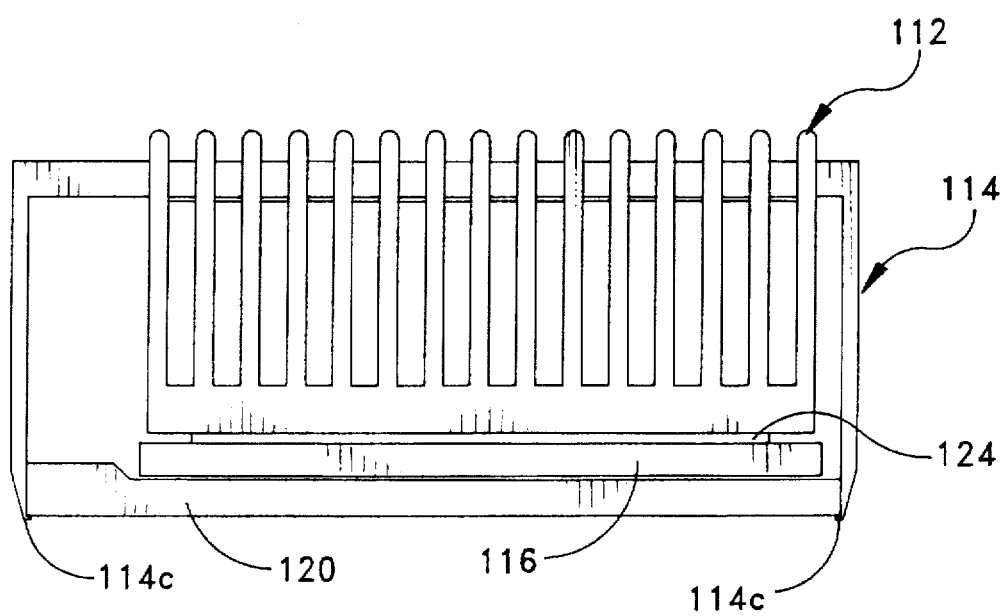
FIG. 23 is a front view of the alternative embodiment shown in FIG. 22.
Figure 24:
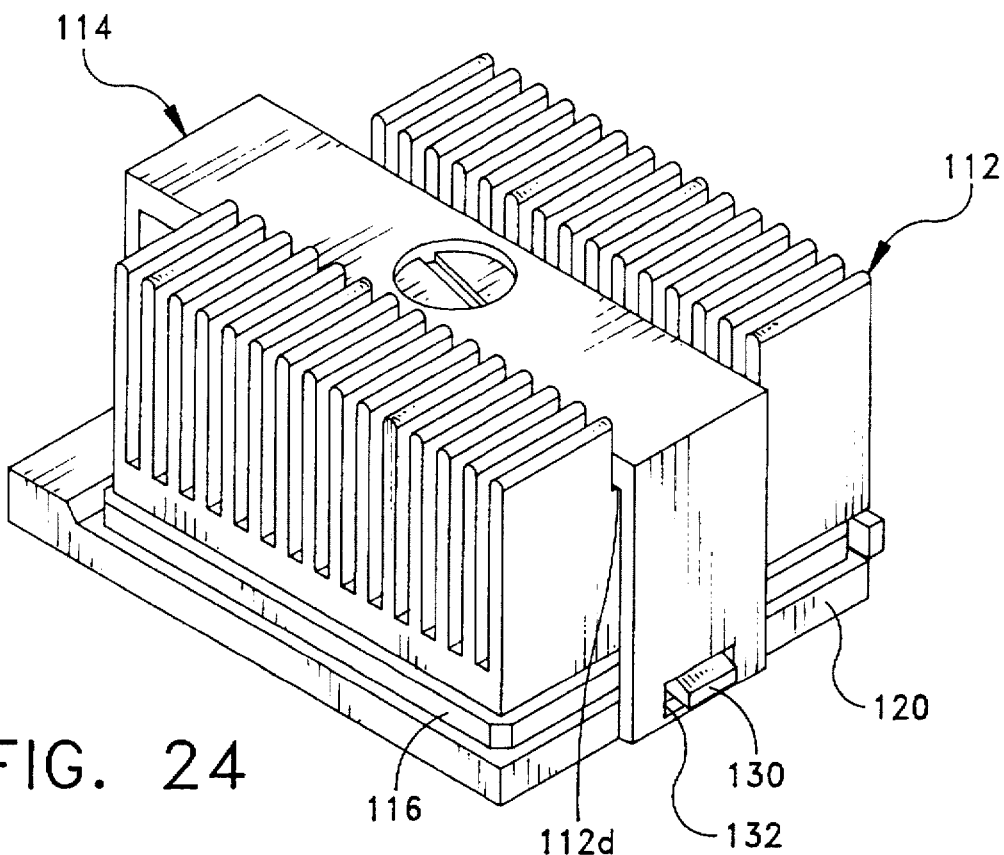
FIG. 24 is a perspective view of yet another alternative embodiment of the present invention illustrating an alternative structure for securing the retaining clip of the present invention to an electronic device package socket.
Figure 25:
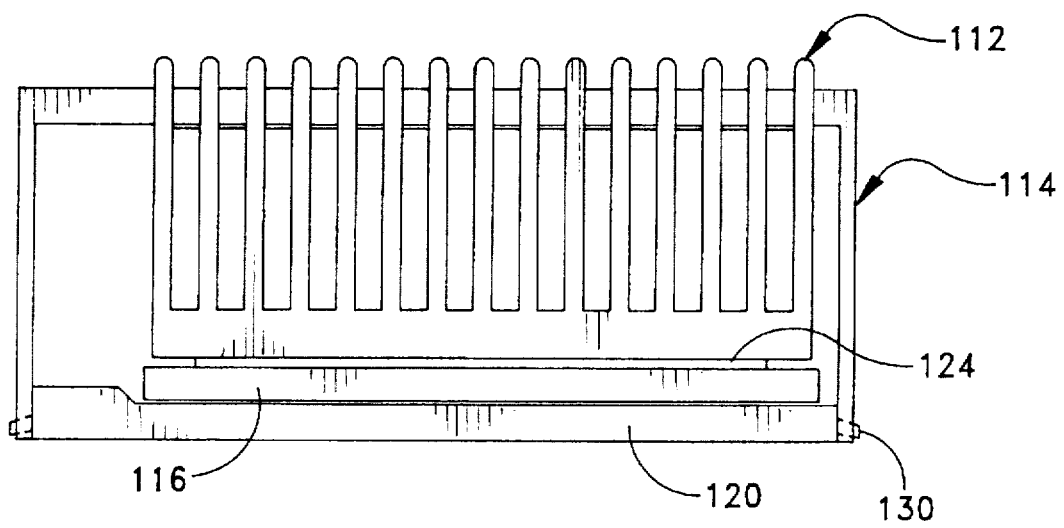
FIG. 25 is a front view of the alternative embodiment of FIG. 24.

FIGS. 22–25 illustrate still further embodiments of the present invention. FIG. 22 provides a retaining clip with slightly elongated downwardly depending legs 114b to effectively engage the marginal portions of socket 120 into which electronic device package 116 is installed. FIG. 23 shows a front view of the alternative embodiment of FIG. 22 showing such engagement. FIGS. 24 and 25 illustrate connection of the downwardly depending legs 114b to protrusions 130 emanating from a ZIF-type socket into which electronic device package 116 is installed. Leg apertures 132 effectively engage protrusions 130 to retain the heatsink assembly in place.

FIGS. 26–29 illustrate additional alternative embodiments of the present invention which are specifically designed for accommodating heatsink members which are relatively tall in height. Such heatsinks require a retaining clip 14 with relatively long downwardly depending legs 14b. When legs 14b become fairly long to accommodate taller heatsinks, they tend to bow out upon tightening of adjustment member 18 and may disengage with its mount support, such as electronic device package 16 or socket 20.

Figure 26:
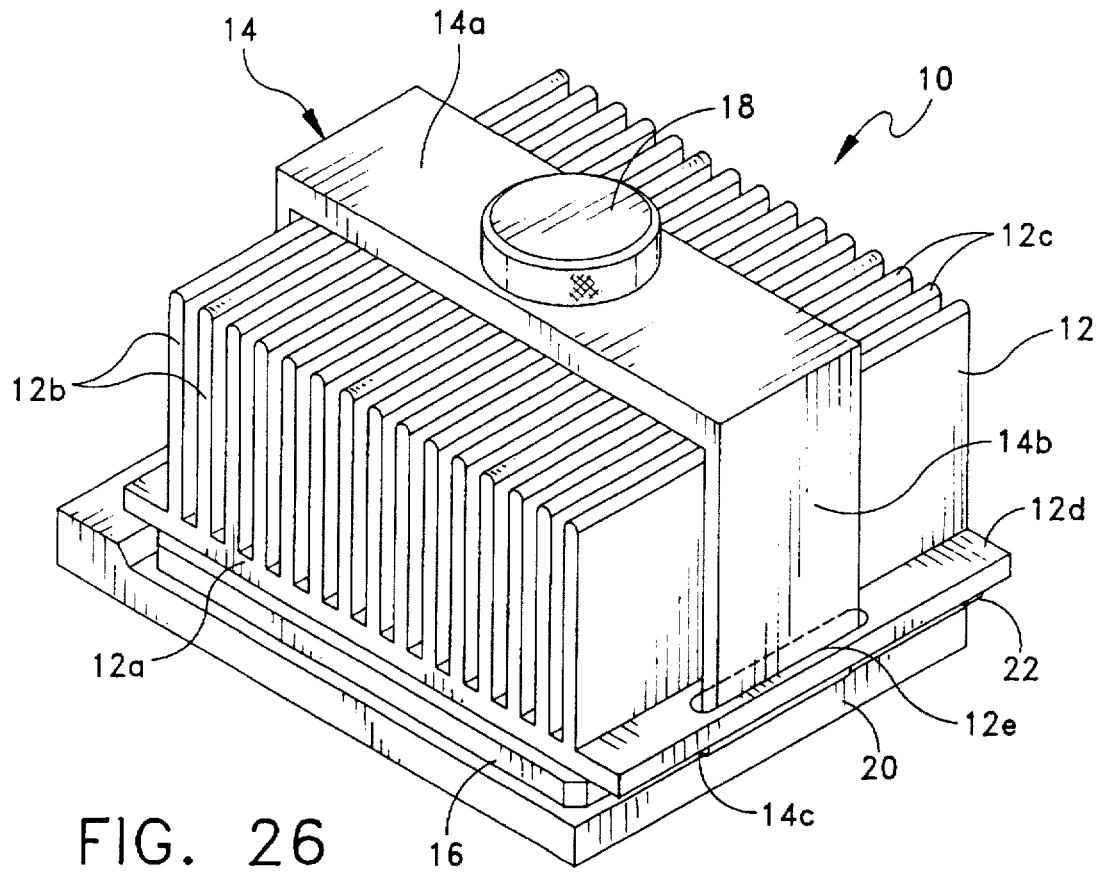
FIG. 26 is a perspective view of an alternative embodiment of the present invention with a heatsink extension to prevent bowing of the retaining clip legs.
Figure 27:
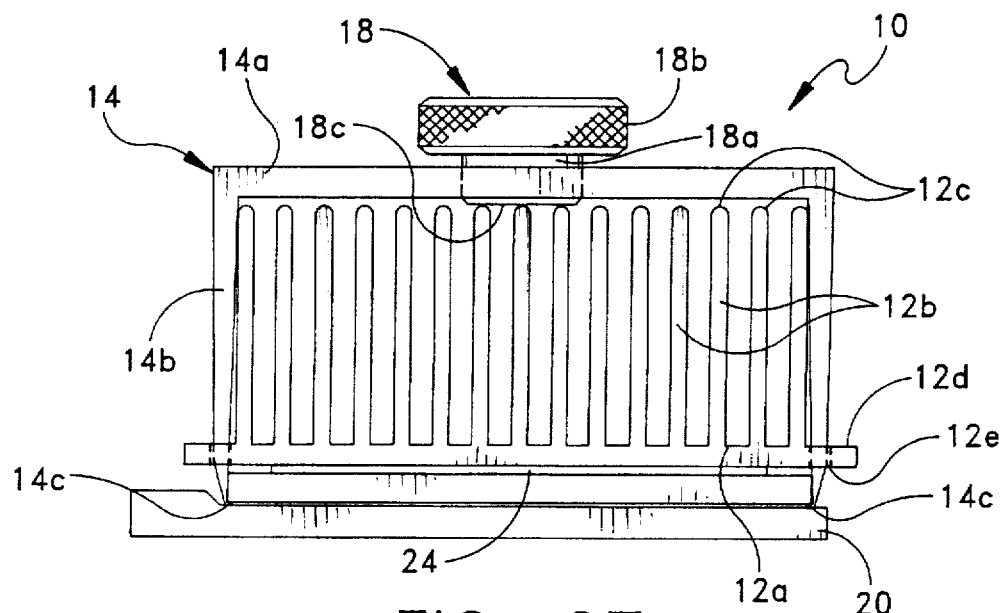
FIG. 27 is a front view of the alternative embodiment of FIG. 26.
Figure 28:
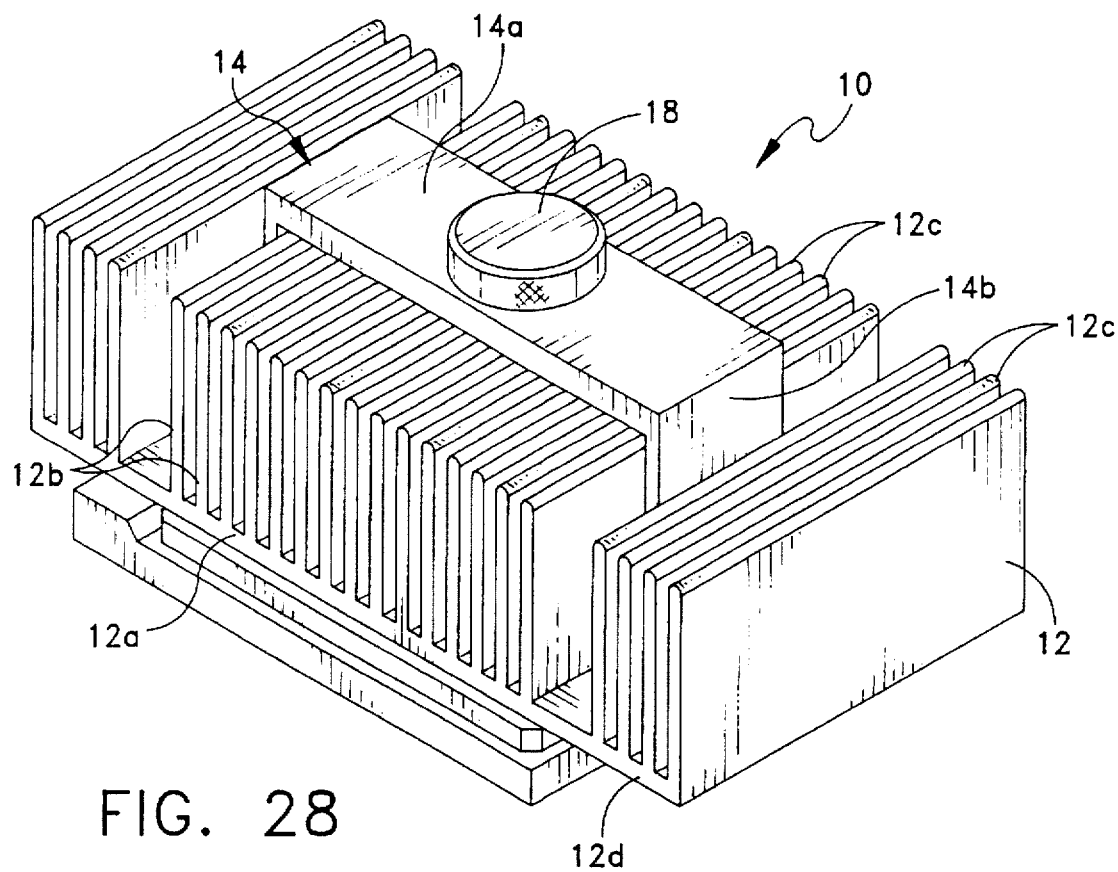
FIG. 28 is a perspective view of another alternative embodiment of the present invention with a heatsink extension carrying additional heat dissipating elements.
Figure 29:
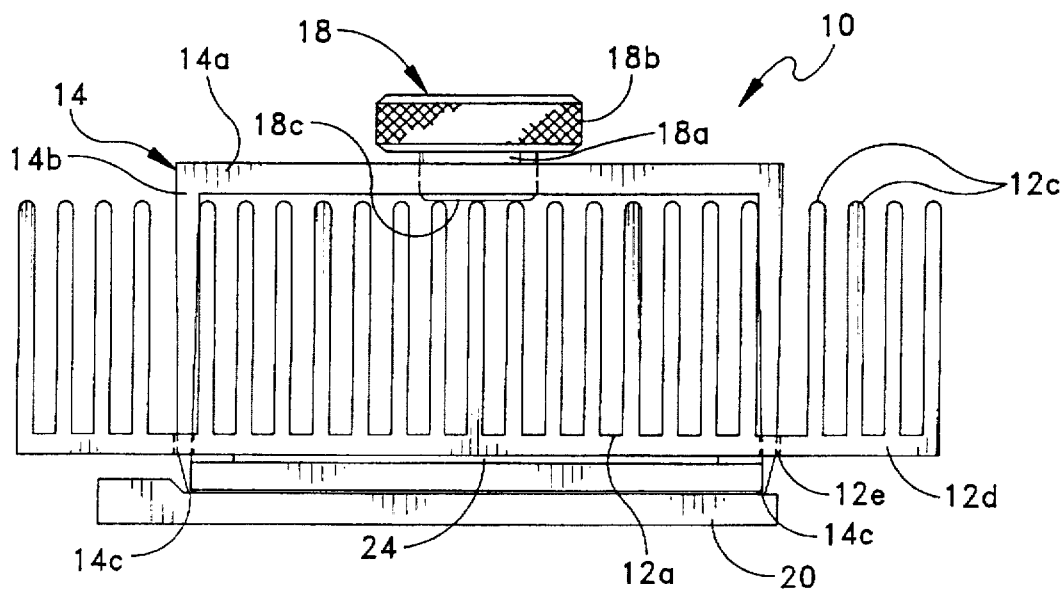
FIG. 29 is a front view of the alternative embodiment of FIG. 28.

As shown in FIGS. 26 and 27, a heatsink extension 12d is provided with slot 12e on opposing sides of the heatsink 12 for receiving legs 14b therethrough. Upon tightening of adjustment member 18, legs 14b are completely contained within slot 12e to prevent unwanted bowing. In FIGS. 28 and 29, heatsink extension 12d can be enlarged and populated with additional fins 12c. As a result, a heatsink 12, which is larger than the surface area of electronic device package 16, can be employed.

It is preferred that the retaining clip of the preferred embodiment and alternative embodiments be made of a high temperature resistant and high creep resistant plastic in light of the likely high temperature environment about an electronic device package. Preferably, the retaining clip material is long fiber plastic such as LNP Verton UF-700-110-HS (PPA 50% long fiber). In addition, adjustment member 18 and 118 may be plastic as well. Alternatively, both the retaining clip and adjustment members may be made of metal, such as aluminum. The shape in an configuration of heatsink members 12 and 112 are shown by way of example. The shape and configuration of the heatsink members may have a radial fin configuration emanating from a central bore, as well as a wide array of other heatsink configurations known in the art.

It would be appreciated by those skilled in the art that various changes and modifications can be made to the illustrated embodiments without departing from the spirit of the present invention. All such modifications and changes are intended to be covered by the appended claims.

What is claimed is:

1. A heat sink assembly for removing heat from an electronic device package having a top surface, comprising:

a heat sink member, having a base member defining a flat bottom surface and a plurality of upstanding fins, the top portion thereof defining an upper surface, disposed on an electronic device package; said flat bottom surface of said heat sink member being in flush communication with said top surface of said electronic device package;

a retaining clip, having a central member and a pair of legs depending downwardly from respective opposing ends of said central member with ends of said pair of legs not connected to said central member being free ends, an aperture disposed through said central member defining a bore; female threading formed in said bore; means for securing said free ends of said pair of legs to said electronic device package; said retaining clip being positionable over and embracing said heat sink member with said bore being proximal with said upper surface of said heat sink member; and a cylindrical adjustment member, having male threading thereon, threadably received through said bore into communication with said upper surface of said heat sink member thus maintaining said heat sink member in pressure and tension controlled flush communication with said electronic device package.

2. The heat sink assembly of claim 1, wherein said flat bottom surface of said heat sink member is dimensioned to be substantially similar in dimension to said top surface of said electronic device package.

3. The heat sink assembly of claim 1, wherein said means for securing said free ends of said pair of legs to said electronic device package are inwardly directed lips, respectively emanating from said free ends of said pair of legs into communication with respective opposing marginal portions of said electronic device package.

4. The heat sink assembly of claim 1, wherein said cylindrical adjustment member further comprises a knurled head.

5. A heat sink assembly for removing heat from an electronic device package having a top surface, comprising:

a heat sink member, having a flat bottom surface and an upper surface, disposed on an electronic device package; said flat bottom surface of said heat sink member being in flush communication with said top surface of said electronic device package; a channel formed in said upper surface of said heat sink member defining a channel floor;

a retaining clip, having a central member and a pair of legs depending downwardly from respective opposing ends of said central member with ends of said pair of legs not connected to said central member being free ends, an aperture disposed through said central member defining a bore; female threading formed in said bore; means for securing said free ends of said pair of legs to said electronic device package; said retaining clip being positionable in said channel and over and embracing said heat sink member with said bore being proximal with said channel floor of said heat sink member; and a cylindrical adjustment member, having male threading thereon, threadably received through said bore into communication with said channel floor of said heat sink member and below said upper surface of said heat sink member thus maintaining said heat sink member in pressure and tension controlled flush communication with said electronic device package.

6. The heat sink assembly of claim 5, wherein said cylindrical adjustment member includes an enlarged foot for engagement with said channel floor.

7. The heat sink assembly of claim 6, wherein said central member of said retaining clip includes a recessed seat about said bore on its underside for receiving said foot therein when said cylindrical adjustment member is threaded up into said bore.

8. The heat sink assembly of claim 5, wherein said heat sink member includes a base member, defining said flat bottom surface, and a plurality of upstanding fins, the top portion thereof defining said upper surface of said heat sink member.

9. The heat sink assembly of claim 5, wherein said flat bottom surface of said heat sink member is dimensioned to be substantially similar in dimension to said top surface of said electronic device package.

10. The heat sink assembly of claim 5, further comprising:
an fan secured to said upper surface of said heat sink member and spanning across said channel.

11. The heat sink assembly of claim 5, wherein said means for securing said free ends of said pair of legs to said electronic device package are inwardly directed lips, respectively emanating from said free ends of said pair of legs into communication with respective opposing marginal portions of said electronic device package.

12. The heat sink assembly of claim 5, wherein said cylindrical adjustment member further includes a means for facilitating rotation thereof.

13. The heat sink assembly of claim 12, wherein said means for facilitating rotation thereof is a slot disposed in a top surface of said cylindrical adjustment member.

14. A heat sink assembly for removing heat from an electronic device package having a top surface, comprising:
an electronic device socket; said electronic device package being installed therein;

a heat sink member, having a base member defining a flat bottom surface and a plurality of upstanding fins, the top portion thereof defining an upper surface, disposed on an electronic device package; said flat bottom surface of said heat sink member being in flush communication with said top surface of said electronic device package;

a retaining clip, having a central member and a pair of legs depending downwardly from respective opposing ends of said central member with ends of said pair of legs not connected to said central member being free ends, an aperture disposed through said central member defining a bore; female threading formed in said bore; means for securing said free ends of said pair of legs to said electronic device socket; said retaining clip being positionable over and embracing said heat sink member with said bore being proximal with said upper surface of said heat sink member; and a cylindrical adjustment member, having male threading thereon, threadably received through said bore into communication with said upper surface of said heat sink member thus maintaining said heat sink member in pressure and tension controlled flush communication with said electronic device package.

15. The heat sink assembly of claim 14, wherein said means for securing said free ends of said pair of legs to said electronic device socket are inwardly directed lips, respectively emanating from said free ends of said pair of legs into communication with respective opposing marginal portions of said electronic device socket.

16. The heat sink assembly of claim 15, further comprising:
at least one outwardly and laterally projecting protrusion emanating, respectively, from opposing sides of said electronic device socket.

17. The heat sink assembly of claim 16, wherein said means for securing said free ends of said pair of legs to said electronic device socket are apertures proximal to each of said respective free ends of said pair of legs for receiving said outwardly and laterally projecting protrusions.

18. A heat sink assembly for removing heat from an electronic device package having a top surface, comprising:
an electronic device socket; said electronic device package being installed therein;

a heat sink member, having a flat bottom surface and an upper surface, disposed on an electronic device package; said flat bottom surface of said heat sink member being in flush communication with said top surface of said electronic device package; a channel formed in said upper surface of said heat sink member defining a channel floor;

a retaining clip, having a central member and a pair of legs depending downwardly from respective opposing ends of said central member with ends of said pair of legs not connected to said central member being free ends, an aperture disposed through said central member defining a bore; female threading formed in said bore; means for securing said free ends of said pair of legs to said electronic device socket; said retaining clip being positionable in said channel and over and embracing said heat sink member with said bore being proximal with said channel floor of said heat sink member; and a cylindrical adjustment member, having male threading thereon, threadably received through said bore into communication with said channel floor of said heat sink member and below said upper surface of said heat sink member thus maintaining said heat sink member in pressure and tension controlled flush communication with said electronic device package.

19. The heat sink assembly of claim 18, wherein said means for securing said free ends of said pair of legs to said electronic device socket are inwardly directed lips, respectively emanating from said free ends of said pair of legs into communication with respective opposing marginal portions of said electronic device socket.

20. The heat sink assembly of claim 18, further comprising:
at least one outwardly and laterally projecting protrusion emanating, respectively, from opposing sides of said electronic device socket.

21. The heat sink assembly of claim 20, wherein said means for securing said free ends of said pair of legs to said electronic device socket are apertures proximal to each of said respective free ends of said pair of legs for receiving said outwardly and laterally projecting protrusions.

* * * * *